US012765405B2

(12) United States Patent
Lee et al.

(10) Patent No.: US 12,765,405 B2
(45) Date of Patent: Oct. 13, 2026

(54) METHOD FOR FORMING A SHIELDING LAYER ON A SEMICONDUCTOR DEVICE

(71) Applicant: JCET STATS ChipPAC Korea Limited, Incheon (KR)

(72) Inventors: SeungHyun Lee, Incheon (KR); HunTaek Lee, Gyeonggi-do (KR); KyoungHee Park, Seoul (KR); SeongHwan Park, Incheon (KR); YoungHoon Jeon, Incheon (KR); HeeSoo Lee, Incheon (KR)

( * ) Notice: Subject to any disclaimer, the term of this patent is extended or adjusted under 35 U.S.C. 154(b) by 451 days.

(21) Appl. No.: 18/475,255

(22) Filed: Sep. 27, 2023

(65) Prior Publication Data

US 2024/0120268 A1 Apr. 11, 2024

(30) Foreign Application Priority Data

Oct. 8, 2022 (CN) ......................... 202211223064.9

(51) Int. Cl.

| | |
|---|---|
| ***H01L 23/498*** | (2006.01) |
| ***H01L 21/48*** | (2006.01) |
| ***H01L 21/56*** | (2006.01) |
| ***H01L 23/552*** | (2006.01) |
| ***H01L 25/16*** | (2023.01) |
| ***H10W 42/20*** | (2026.01) |
| ***H10W 70/05*** | (2026.01) |
| ***H10W 70/65*** | (2026.01) |
| ***H10W 74/01*** | (2026.01) |
| ***H10W 90/00*** | (2026.01) |

(52) U.S. Cl.

CPC ........... *H10W 70/65* (2026.01); *H10W 42/20* (2026.01); *H10W 70/05* (2026.01); *H10W 74/01* (2026.01); *H10W 90/00* (2026.01)

(58) Field of Classification Search

CPC ........... H01L 23/49838; H01L 21/4846; H01L 21/56; H01L 23/552; H01L 25/162; H01L 23/3128; H01L 23/49805; H01L 25/0652; H01L 25/0655; H01L 23/3135; H01L 21/561; H01L 23/3121; H01L 25/105; H01L 21/568; H01L 21/565; H01L 21/78; H01L 23/295; H01L 23/3178; H01L 23/49811; H01L 25/16; H01L 25/18

USPC .......................................................... 257/659

See application file for complete search history.

(56) References Cited

U.S. PATENT DOCUMENTS

| | | | | |
|---|---|---|---|---|
| 7,053,477 | B2 | 5/2006 | Karnezos et al. | |
| 7,589,407 | B2 | 9/2009 | Karnezos | |
| 9,627,228 | B1 * | 4/2017 | Chen | H01L 21/78 |
| 9,793,222 | B1 * | 10/2017 | Lee | H01L 23/552 |
| 2014/0227830 | A1 | 8/2014 | Yao et al. | |

(Continued)

FOREIGN PATENT DOCUMENTS

TW 202114141 A 4/2021

*Primary Examiner* — Tong-Ho Kim

(74) *Attorney, Agent, or Firm* — Junhe Law Office P.C.; Yi Zhang

(57) ABSTRACT

A method for forming a shielding layer on a semiconductor device is disclosed. The semiconductor device comprises a bond pad formed on a front side of a substrate and extends a first lateral surface of the substrate. The method comprises: etching a portion of the bond pad adjacent to the first lateral surface, to form a gap between the bond pad and the first lateral surface; attaching a filler onto the bond pad to fill the gap; and applying a shielding layer to a back side of the substrate.

7 Claims, 13 Drawing Sheets

(56) References Cited

U.S. PATENT DOCUMENTS

| | | | | |
|---|---|---|---|---|
| 2017/0280561 | A1* | 9/2017 | Haney | H01L 23/552 |
| 2018/0166363 | A1* | 6/2018 | Heppner | H01L 21/768 |
| 2018/0323170 | A1* | 11/2018 | Kim | H01L 25/0652 |
| 2019/0214550 | A1 | 7/2019 | Bhushan et al. | |
| 2022/0068835 | A1 | 3/2022 | Kim et al. | |

* cited by examiner

METHOD FOR FORMING A SHIELDING LAYER ON A SEMICONDUCTOR DEVICE

TECHNICAL FIELD

The present application generally relates to semiconductor packaging technology, and more particularly, to a method for forming a shielding layer on a semiconductor device.

BACKGROUND OF THE INVENTION

The semiconductor industry is constantly faced with complex integration challenges as consumers want their electronic products to be lighter, smaller and have higher performance with more and more functionalities. One of the solutions is System-in-Package (SiP). SiP is a functional electronic system or sub-system that includes in a single package two or more heterogeneous semiconductor dice or other passive devices, such as a logic chip, a memory, integrated passive devices (IPD), RF filters, sensors, heat sinks, or antennas. However, there may be interferences such as electromagnetic interference (EMI) between these devices and from the external environment.

Typically, a semiconductor device may be provided with a metal cover or a uniformly spread coating around its outer periphery as a shielding layer for EMI reduction. However, some semiconductor devices may include components (e.g., bond pads) that are required to be exposed to the external environment, which cannot be formed with the shielding layer. Actually, the components exposed to the external environment may be shorted with the shielding layer, which may cause the EMI shielding layer impracticable.

Therefore, a need exists for forming a shielding layer on a semiconductor device that includes components exposed to the external environment.

SUMMARY OF THE INVENTION

An objective of the present application is to provide a method for forming a shielding layer on a semiconductor device.

In an aspect of the present application, a method for forming a shielding layer on a semiconductor device is disclosed. The semiconductor device comprises a bond pad formed on a front side of a substrate and extends to a first lateral surface of the substrate. The method comprises: etching a portion of the bond pad adjacent to the first lateral surface, to form a gap between the bond pad and the first lateral surface; attaching a filler onto the bond pad to fill the gap; and applying a shielding layer to a back side of the substrate.

In another aspect of the present application, a method for forming a semiconductor device is disclosed. The method comprises: providing a substrate strip having a device array with a plurality of device regions defined by a plurality of saw streets, wherein the plurality of device regions are connected together by a wiring grid formed on a front surface of the substrate strip; singulating at the saw streets the substrate strip to form a plurality of semiconductor devices each corresponding to one of the plurality device regions, wherein each semiconductor device has a substrate and a bond pad which is a part of the wiring grid, and wherein the bond pad is formed on a front side of the substrate and extending to a first lateral surface of the substrate; etching a portion of the bond pad adjacent to the first lateral surface, to form a gap between the bond pad and the first lateral surface; attaching a filler onto the bond pad to fill the gap; and applying a shielding layer to a back side of the substrate.

In another aspect of the present application, a semiconductor device is disclosed. The semiconductor device comprises: a substrate; a bond pad formed on a front side of the substrate and extending to a position having a distance from a first lateral surface of the substrate; an encapsulant layer supported on a back side of the substrate; and a shielding layer formed on the back side of the substrate, wherein the shieling layer covers the encapsulant layer.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIGS. 6-1A and 6-1B to FIGS. 6-4A and 6-4B are schematic diagrams illustrating various steps of a method for forming a shielding layer on a semiconductor device according to another embodiment of the present application.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
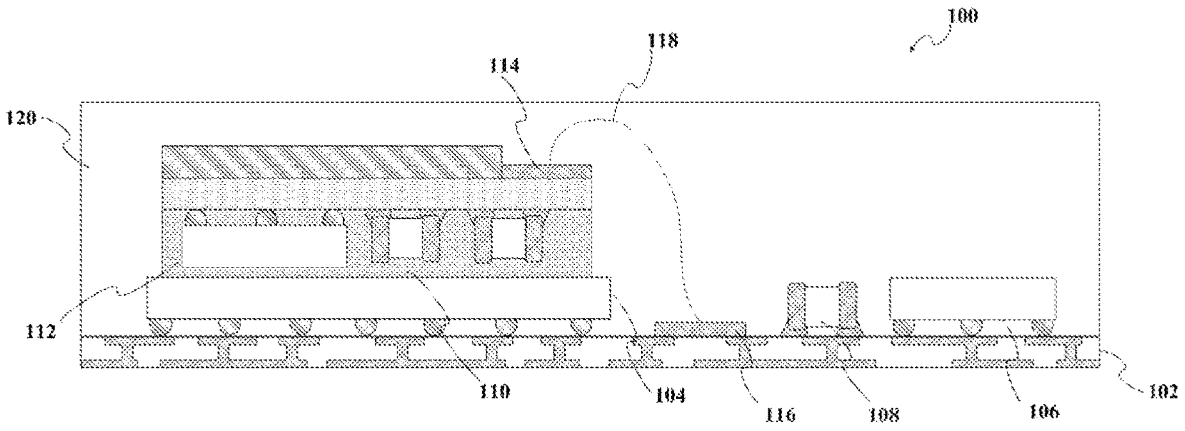
FIG. 1 is a schematic diagram showing an electronic device according to an embodiment of the present application.

FIG. 1 is a schematic diagram showing an electronic device 100 according to an embodiment of the present application.

As shown in FIG. 1, the electronic device 100 includes an electronic device substrate 102 such as a printed circuit board or an interposer. A semiconductor die 104 is mounted on a front side of the electronic device substrate 102. In some embodiment, some other electronic components such as one or more additional semiconductor dice 106 or one or more passive device 108 (e.g., capacitors or resistors) can be mounted on the electronic device substrate 102 as well. These electronic components 106 and 108 may be further coupled to the semiconductor die 104 through interconnect structures inside the electronic device substrate 102 such as redistribution layers.

A semiconductor device 110 is inverted and stacked on top of the semiconductor die 104, instead of mounted on the electronic device substrate 102 directly. The semiconductor device 110 may be a semiconductor package with several electronic components encapsulated within an encapsulant layer 112.

In order to allow for the electrical connection between the semiconductor device 110 and the electronic device substrate 102, at least one bond pad 114 is formed on a front side of the semiconductor device 110 and exposed from the front surface of the semiconductor device 110, and at least one bond pad 116 is formed on the electronic device substrate 102, which are connected with each other through a set of wire bonds 118. In this way, the semiconductor device 110 can be further coupled to the semiconductor die 104 and the other electronic components 106 and 108 on the electronic device substrate 102. Furthermore, an encapsulant cap 120 can be formed at the front side of the electronic device substrate 102, covering all the other components thereon for purpose of protection.

Figure 2A:
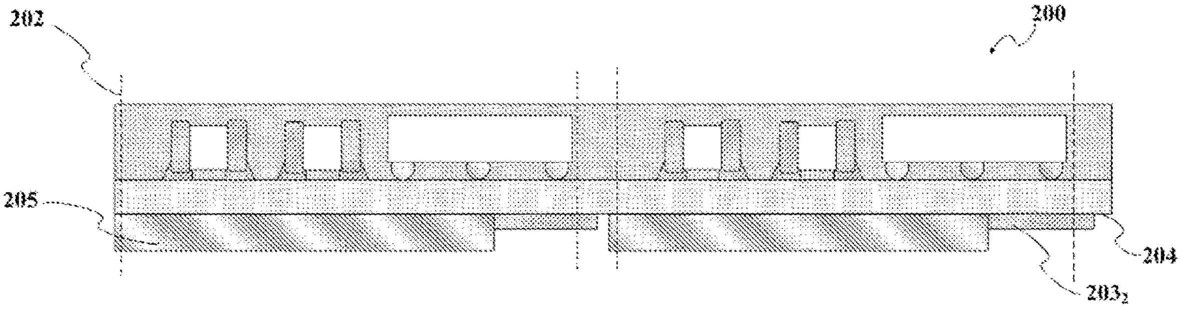
FIG. 2A and FIG. 2B are schematic diagrams showing an example of a substrate strip for forming the semiconductor device in FIG. 1 according to an embodiment of the present application.
Figure 2B:
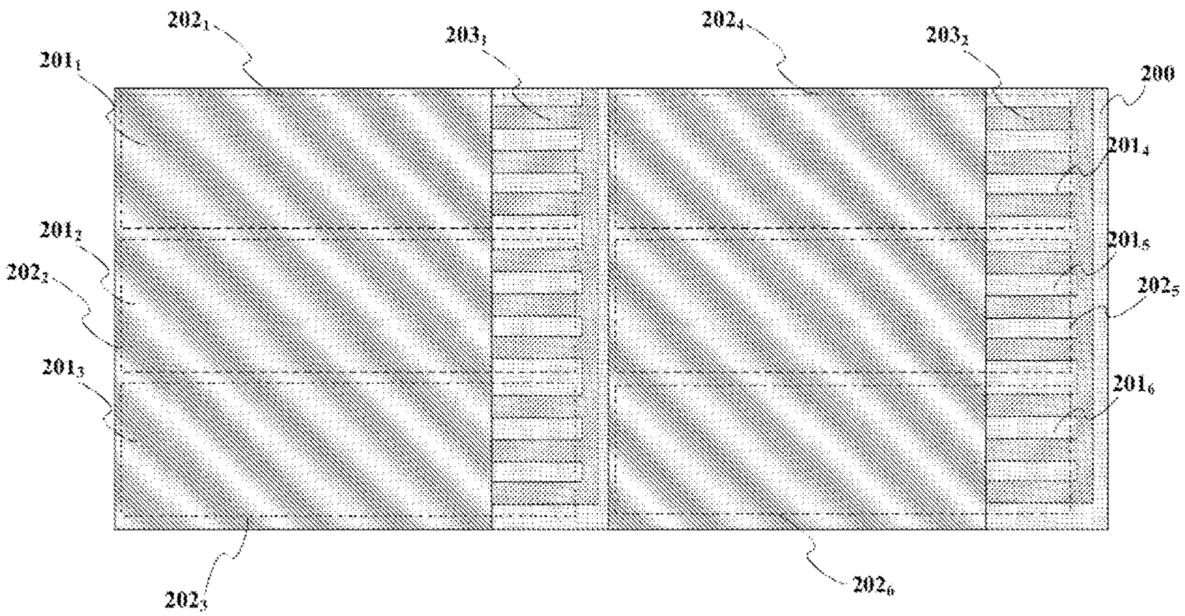

In some embodiments, the semiconductor device 110 shown in FIG. 1 can be saw or otherwise singulated from a substrate strip. FIG. 2A and FIG. 2B are schematic diagrams showing a substrate strip 200 for forming the semiconductor device according to an embodiment of the present application.

As shown in FIG. 2A and FIG. 2B, the substrate strip 200 may include multiple device regions (in the embodiment, six device regions 2011-2016) which form a device array, and each device region corresponds to a semiconductor device (for example, the semiconductor device 110 shown in FIG. 1). Those skilled in the art can understand that though the substrate strip 200 is illustrated as including six device regions for illustration purpose, a substrate strip may include any number of device regions as desired. The device regions 2011-2016 are defined by a plurality of saw streets 2021-2026 as illustrated by the dashed lines in FIG. 2A and FIG. 2B. The manufacturer can saw the substrate strip 200 at the saw streets 2021-2026 to singulate the device regions 2011-2016 so as to form semiconductor devices.

The substrate strip 200 also includes a first wiring grid 2031 and a second wiring grid 2032 formed on a front surface 204 of the substrate strip 200. As illustrated in FIG. 2B, before singulation, the device regions 2011-2013 are connected together by the wiring grid 2031, and the device regions 2014-2016 are connected together by the wiring grid 2032, because it is easier to form these wires in the form of grid (e.g., during a plating process). The wiring grid 2031 and the wiring grid 2032 can be used to form the bond pad(s) on the semiconductor devices singulated from the substrate strip 200 and can be formed on the substrate strip 200 based on practical needs. In the example, the wiring grid 2031 includes three branches extending toward each of the device regions 2011-2013 and the wiring grid 2032 includes three branches to each of the device regions 2014-2016, which means that each of the semiconductor devices singulated from the substrate strip 200 that are respectively corresponding to the device regions 2011-2016 should include three bond pads. However, the manufacturer can set the number of branches of a wiring grid to each of the device regions so as to form a different number of bond pads on the singulated semiconductor devices.

The substrate strip 200 may also include dielectric layers 205 formed on the front surface 204 of the substrate strip 200. The dielectric layers 205 can be sawed apart from each other at the saw streets 2021-2026 to form dielectric layers of the semiconductor device singulated from the substrate strip 200.

Figure 3A:
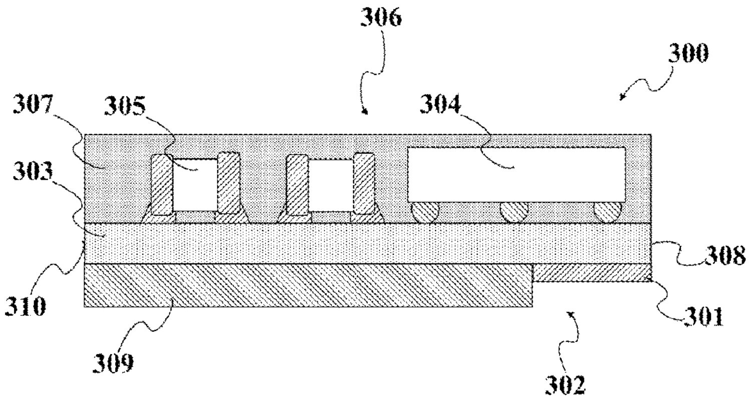
FIG. 3A and FIG. 3B are schematic diagrams showing a semiconductor device singulated from the substrate strip in FIG. 2A and FIG. 2B according to an embodiment of the present application.
Figure 3B:
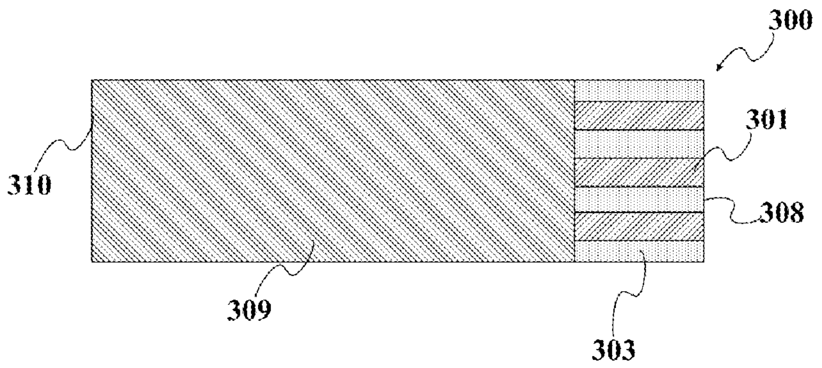

FIG. 3A and FIG. 3B are schematic diagrams showing a semiconductor device 300 singulated from the substrate strip 200 shown in FIGS. 2A and 2B according to an embodiment of the present application.

As shown in FIGS. 3A and 3B, the semiconductor device 300 includes three bond pads 301 on a front side 302 of a substrate 303 for electrically connecting with the bond pad(s) formed on a corresponding electronic device substrate (for example, the bond pad 116 on the electronic device substrate 102 as shown in FIG. 1), which is a part of a wiring grid on a substrate strip. As discussed above, the semiconductor device 300 may include any number of bond pads on the front side 302 by configuring the number of branches of the wiring grid on the substrate strip.

The semiconductor device 300 may further include one or more semiconductor components, such as a semiconductor die 304 and two discrete devices 305 as shown in FIG. 3A, supported on a back side 306 of the substrate 303. Although the semiconductor device 300 is shown as including one semiconductor die 304 and two discrete devices 305 for illustration purpose, those skilled in the art can understand that a semiconductor device may include any number and any type of such components. For example, the electronic component included in a semiconductor device may include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, a resistor, a capacitor, an inductor etc. The components may be encapsulated by an encapsulant layer 307.

The semiconductor device 300 may also include a dielectric layer 309 formed on the front side 302 of the substrate 303. The dielectric layer 309 is a part of and formed from the dielectric layer 205 of the substrate strip 200 shown in FIGS. 2A and 2B, as discussed above. The dielectric layer 309 may extend from the bond pads 301 to a lateral surface 310 of the substrate 303.

With referring back to FIGS. 2A and 2B, since the bond pads 301 are a part of the wiring grid 2031 or 2032, and the saw street 202 along which the semiconductor device 300 is singulated from the substrate strip 200 should intersect with the wiring grid 2031 or 2032, the bond pads 301 should extend onto a lateral surface 308 of the substrate 303.

Figure 4:
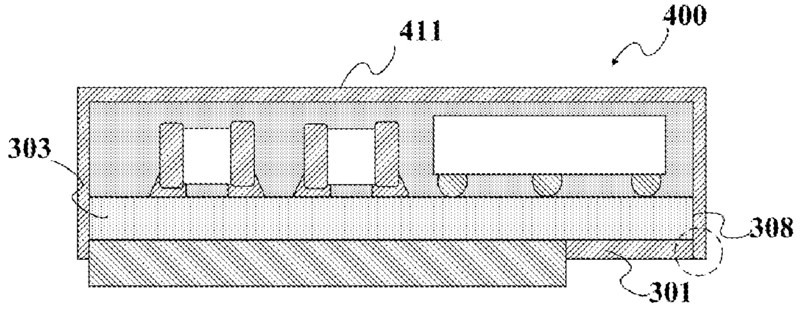
FIG. 4 is schematic diagram showing an EMI shielding layer applied to the semiconductor device in FIG. 3A and FIG. 3B according to an embodiment of the present application.

To prevent electromagnetic interference (EMI) between the components, a shielding layer can be applied to the semiconductor device. FIG. 4 is schematic diagram showing the semiconductor device 300 shown in FIG. 3A and FIG. 3B with an EMI shielding layer 411 applied thereto. However, as shown in FIG. 4, since the bond pads 301 extend to the lateral surface 308 of the substrate 303, if directly applying the EMI shielding layer 411 to the semiconductor device 300, the EMI shielding layer 411 may be directly contact with the bond pads 301, which may result in short issue, as indicated by the dashed line circle. Therefore, directly applying the EMI shielding layer 411 to the semiconductor device 300 may be impracticable. Instead, the inventors conceive an idea to remove a portion of the bond pads within the circled region to avoid the short issue, as will be elaborated below.

FIGS. 5-1A and 5-1B to FIGS. 5-5A and 5-5B illustrate a method for forming an EMI shielding layer onto a semiconductor device (e.g., the semiconductor device shown in FIGS. 3A and 3B) according to an embodiment of the present application, without causing any short to the semiconductor device. In particular, FIGS. 5-1A, 5-2A, 5-3A, 5-4A and 5-5A are sectional views of the semiconductor device during various steps of the method, and FIGS. 5-1B, 5-2B, 5-3B, 5-4B and 5-5B are bottom views of the semiconductor device during various steps of the method.

Figures 1A, 5:
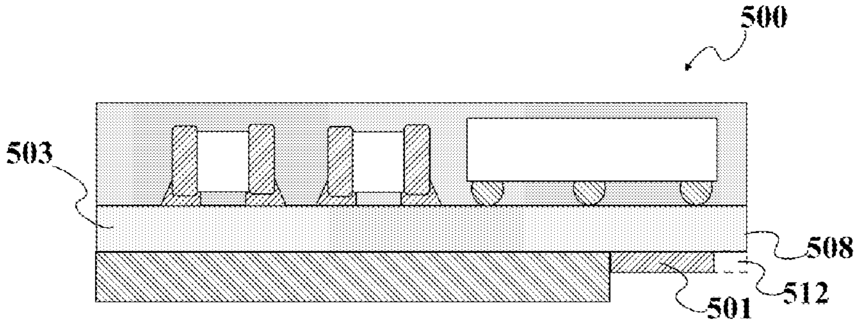
FIGS. 5-1A and 5-1B to FIGS. 5-5A and 5-5B are schematic diagrams illustrating various steps of a method for forming a shielding layer on a semiconductor device according to an embodiment of the present application.
Figures 1B, 5:
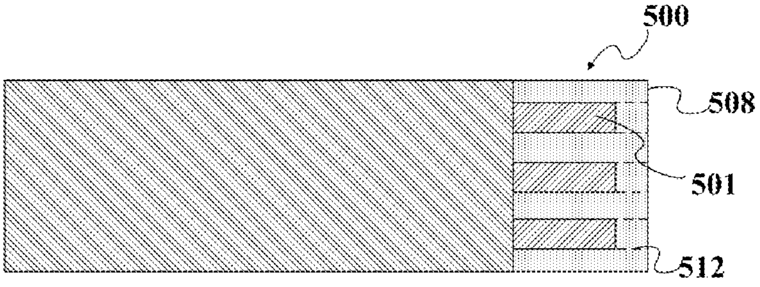
Figures 2A, 5:
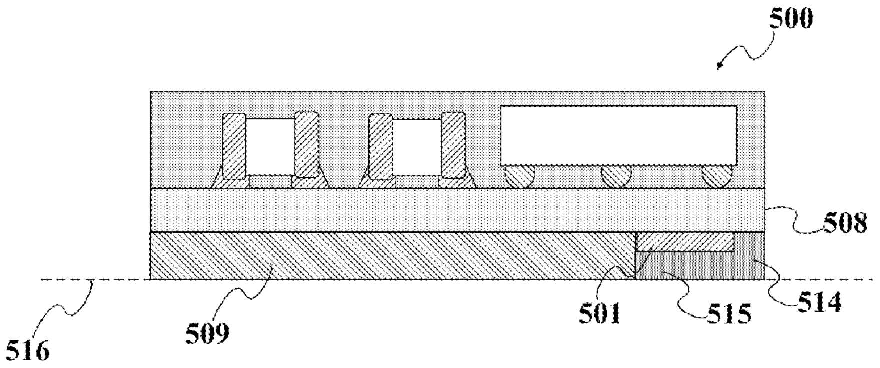
Figures 2B, 5:
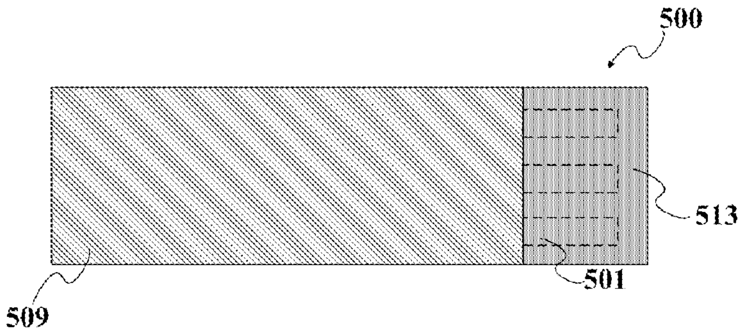
Figures 3A, 5:
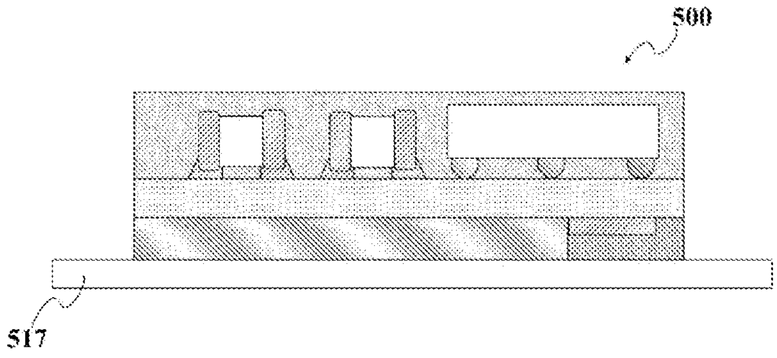
Figures 3B, 5:
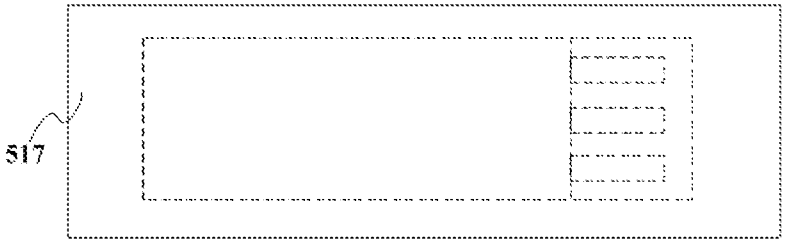

As shown in FIG. 5-1A and FIG. 5-1B, before applying an EMI shielding layer onto the semiconductor device 500, a portion of the bond pads 501 adjacent to the lateral surface 508 of the substrate 503 is etched, to form a gap 512 between the bond pads 501 and the lateral surface 508. The etching process can be performed through laser ablation, chemical etching, electrical ablation or any other suitable etching process. In some embodiments, the gap 512 between the bond pads 501 and the lateral surface 508 of the substrate 503 may be in a range of 0.5 mm to 1 cm, e.g., 0.5 mm, 1 mm, 2 mm, 5 mm, 7 mm or 1 cm. It can be appreciated that the size of the gap can vary depending on the size of the bond pads.

As shown in FIG. 5-2A and FIG. 5-2B, after a portion of the bond pads 501 is etched, a filler 513 can be attached onto the bond pads 501 to fill the gap 512 between the bond pads 501 and the lateral surface 508. In this embodiment, the filler 513 is a tape such as an adhesive tape with an adhesive layer and a base film (e.g., a polyimide film). As illustrated, the tape 513 may include a first portion 514 for filling the gap 512, and a second portion 515 attached onto and covering the bond pads 501. In some embodiments, the tape 513 may further covers at least a portion of the dielectric layer 509 which is at the same side of the substrate 513 as the bond pads 501. In the embodiment shown in FIG. 5-2A, the tape 513 does not cover the dielectric layer 509, and may substantially flush with the dielectric layer 509 to form a flat surface 516, so that the semiconductor device 500 can be conveniently placed onto a carrier, as discussed below. As shown in FIG. 5-2B, for multiple bond pads 501 formed in parallel on the substrate, the filler 513 may not only fill the gap at an end of each bond pad, but also cover the blank zones between these bond pads 501 to avoid these zones being deposited with metal or other similar conductive materials during the subsequent steps.

Next, as shown in FIG. 5-3A and FIG. 5-3B, the semiconductor device 500 may be placed on a carrier 517. In the example, the carrier 517 is a flat platform, while in some other examples, the carrier 517 may be a frame with a periphery of the semiconductor device 500 supported on the frame. The fillers filling the respective gaps of the bond pads can provide non-tilted orientation of the semiconductor device 500, to facilitate uniform deposition of the shielding material to be formed.

Figures 4A, 5:
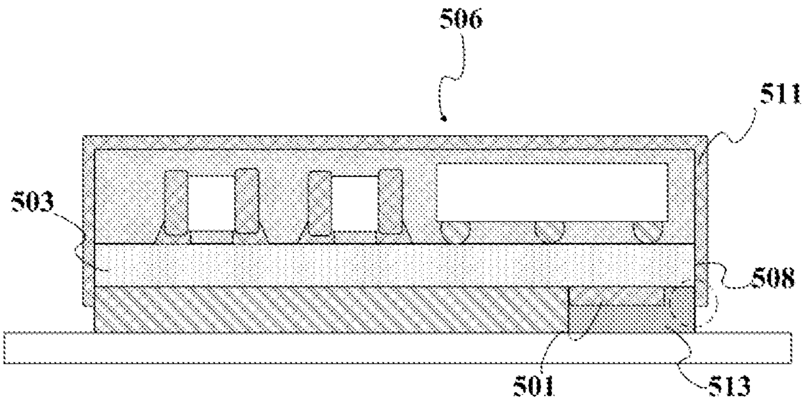
Figures 4B, 5:
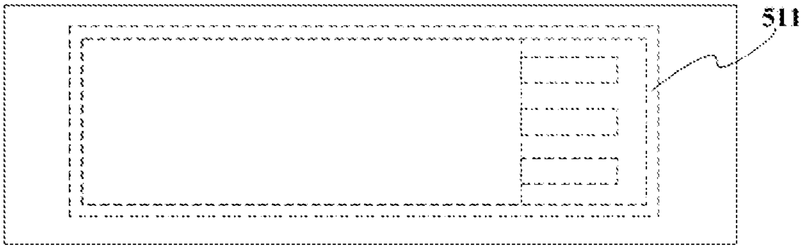

Next, as shown in FIG. 5-4A and FIG. 5-4B, the shielding layer 511 is applied to the back side 506 of the substrate 503 of the semiconductor device 500. For example, a metal material source may be placed at the back side of the substrate 503, mobilized atoms can be directed towards the metal material source to drive the metal material or other material towards the substrate 503 and form the shielding layer 511. It can be appreciated that any physical or chemical vapor deposition processes can be used to form the shielding layer 511 as desired. Since a portion of the bond pads 501 is etched to form respective gaps between the bond pads 501 and the lateral surface 508 of the substrate 503, and the tape 513 is attached onto the bond pads 501, the shielding layer 511 in this embodiment cannot be deposited onto the bond pads 501 but only on the tape 513, as indicated by the dashed line circle.

Figures 5, 5A:
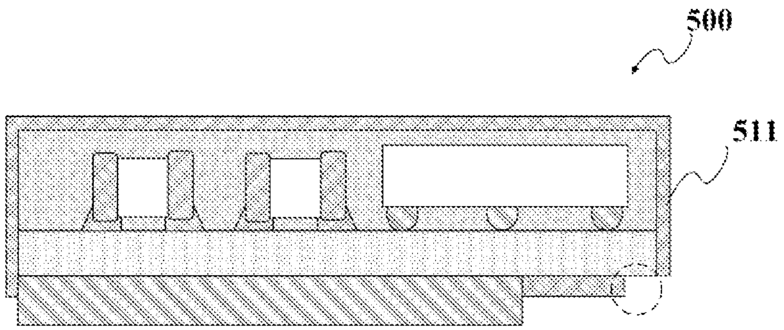
Figures 5, 5B:
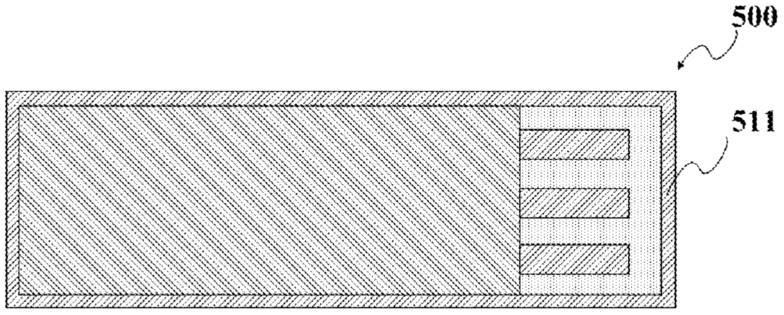

As shown in FIG. 5-5A and FIG. 5-5B, after the shielding layer 511 is applied to the semiconductor device 500, the tape 513 may be detached from the bond pads 501. As indicated by the dashed line circle, there is a gap between each of the bond pads 501 and the shielding layer 511. Therefore, no short is formed between the shielding layer 511 and the bond pads 501. Afterwards, the semiconductor device 500 can be unloaded from the carrier and assembled with other components of an electronic device, such as that electronic device 100 shown in FIG. 1.

FIGS. 6-1A and 6-1B to FIGS. 6-4A and 6-4B are schematic diagrams illustrating various steps of a method for forming a shielding layer on a semiconductor device according to another embodiment of the present application. The step of etching a portion of the bond pad is the same for this embodiment as that shown in FIG. 5-1A and FIG. 5-1B, but the other steps are different from those steps shown in FIGS.

5-2A and 5-2B to FIGS. 5-5A and 5-5B. In particular, FIGS. 6-1A, 6-2A, 6-3A and 6-4A are sectional views of the semiconductor device during various steps of the method, and FIGS. 6-1B, 6-2B, 6-3B and 6-4B are bottom views of the semiconductor device during various steps of the method.

Figures 1A, 6:
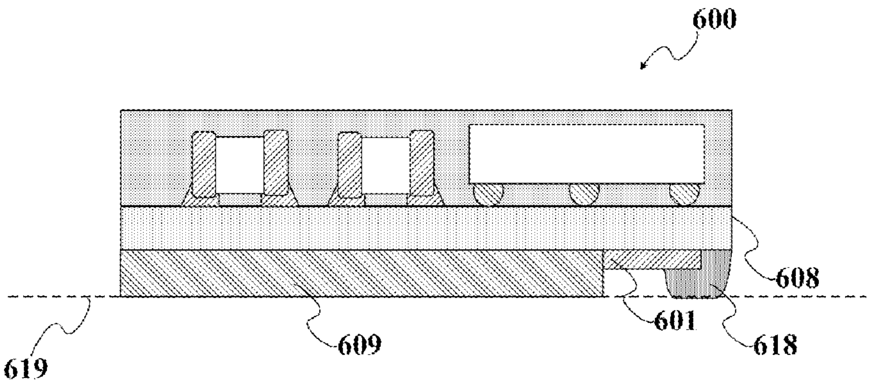
Figures 1B, 6:
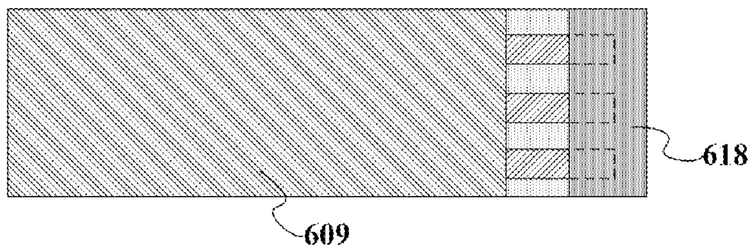
Figures 2A, 6:
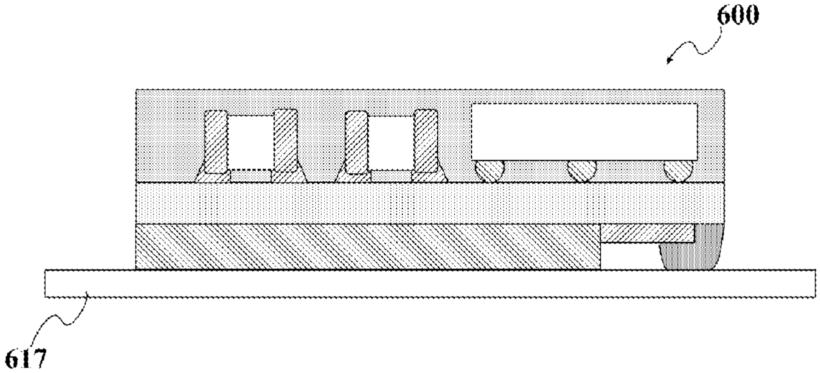
Figures 2B, 6:
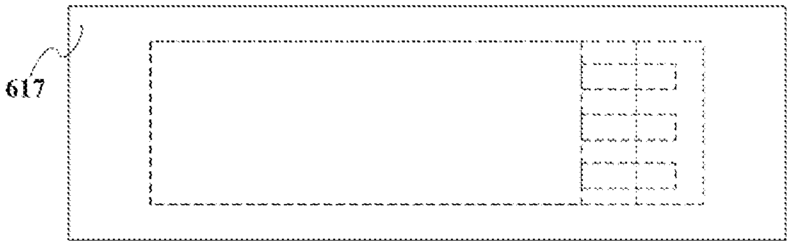
Figures 3A, 6:
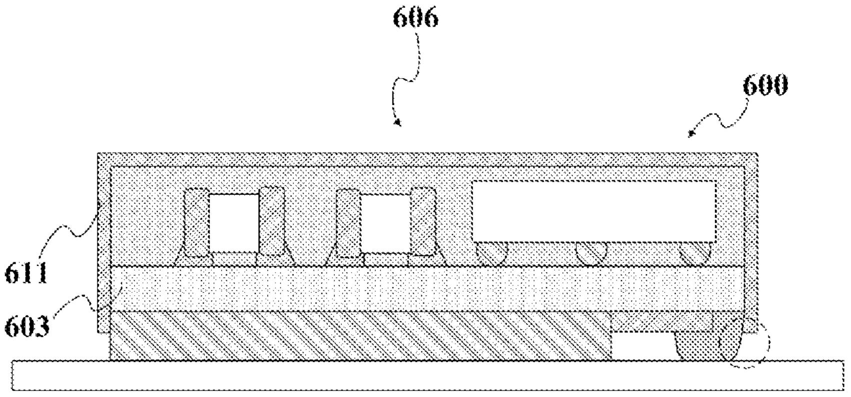
Figures 3B, 6:
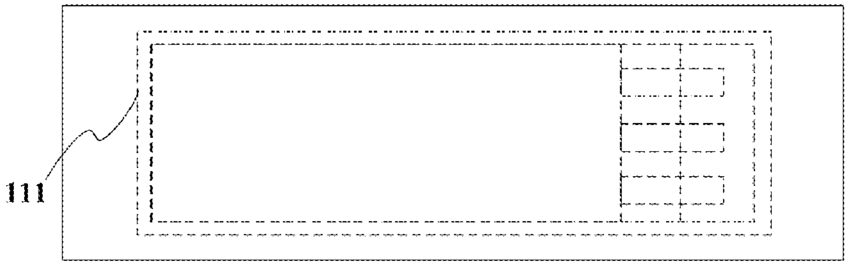
Figures 4A, 6:
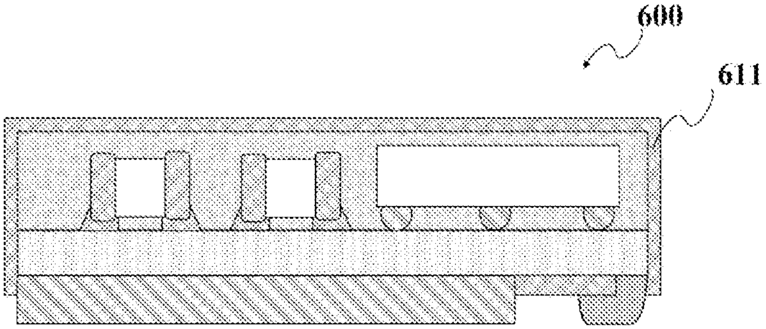
Figures 4B, 6:
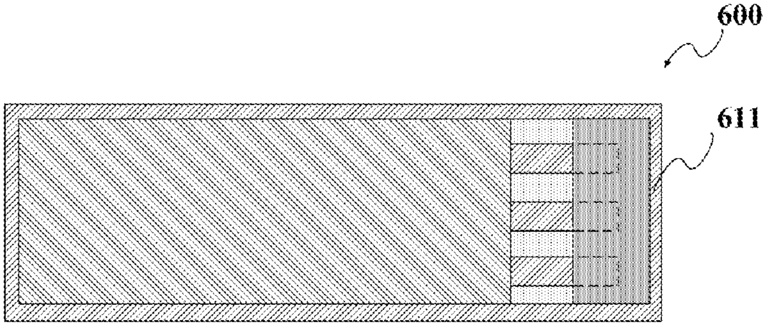

As shown in FIGS. 6-1A and 6-1B, after etching a portion of bond pads on a front side of a substrate, fillers or a filler 618 is attached onto the bond pads 601 to fill the gap between the bond pads 601 and a lateral surface 608 of the substrate. The filler 618 may include an epoxy material, for example, an epoxy adhesive, an epoxy resin etc., which is easy to be applied onto the bond pads 601 and some other adjacent surfaces of the substrate. The filler 618 is attached onto the bond pads 601 by dispensing the epoxy material into the gap, for example, using a liquid dispensing apparatus. The filler 618 may substantially flush with a dielectric layer 609 on the front side of the substrate to form a flat surface 619, so that the semiconductor device 600 can be conveniently placed onto a carrier, as discussed below. In some embodiments, the filler 618 may not cover the entirety of the bond pads 601, but only cover a portion of the bond pads 601, and may have a height that is substantially the same as a height of the dielectric layer 609.

Next, as shown in FIGS. 6-2A and 6-2B, after attaching the filler 618 onto the bond pads 601, the semiconductor device 600 may be placed on a carrier 617. Afterwards, a shielding layer 611 is applied to a back side 606 of the substrate 603, as shown in FIGS. 6-3A and 6-3B. Similarly, the shielding layer 611 is not in contact with the bond pads 601 but only in contact with the filler 618 formed thereon. Since the filler 618 includes an epoxy material or other similar material which is non-conductive, no short is formed between the bond pads 601 and the shielding layer 611, as indicated by the dashed line circle.

As shown in FIGS. 6-4A and 6-4B, after the shielding layer 611 is applied to the semiconductor device 600, the semiconductor device 600 can be unloaded and detached from the carrier 617. In some embodiments, the filler 618 which includes an epoxy material or other non-conductive material may not be detached from the bond pads 601.

Figure 7:
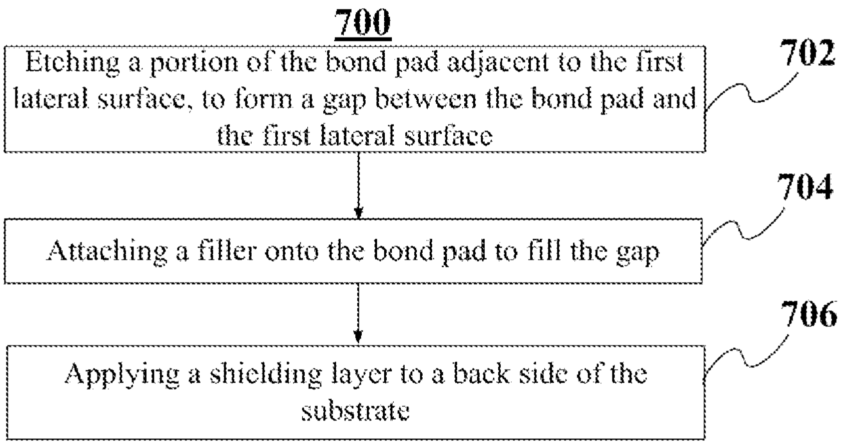
FIG. 7 illustrates a flow chart of a method for forming a shielding layer on a semiconductor device according to an embodiment of the present application.

FIG. 7 illustrates a flow chart of a method 700 for forming a shielding layer on a semiconductor device. The semiconductor device may be the semiconductor device 300 as shown in FIGS. 3A and 3B, which may include bond pads formed on a front side of a substrate and extending to a lateral surface of the substrate.

As shown in FIG. 7, the method 700 starts with step 702, and a portion of the bond pad adjacent to the first lateral surface is etched to form a gap between the bond pad and the first lateral surface. Next, in step 704, a filler is attached onto the bond pad to fill the gap. In some embodiments, the semiconductor device may include a dielectric layer formed on the front side of the substrate, and the filler may substantially flush with the dielectric layer to form a flat surface. In some embodiments, for example, the filler may be a tape which includes a first portion filing the gap and the second portion attached onto and covering the bond pads. In such an embodiment, the filler or the tape may be detached from the semiconductor device after a shielding layer is applied to the semiconductor device. In some embodiments, the filler may include an epoxy material, which may be attached to the bond pads by dispensing the epoxy material into the gap. In such an embodiment, the filler or the epoxy material may or may not be detached from the semiconductor device after a shielding layer is applied to the semiconductor device.

Afterwards, in step 706, a shielding layer is applied to a back side of the substrate. Due to the filler filling the gaps between the bond pads and the lateral surface of the substrate, the shielding layer cannot be deposited in the gaps and electrically connect the bond pads with the shielding layer, and thus no short is formed therebetween.

The discussion herein included numerous illustrative figures that showed various portions of a method for forming a shielding layer on a semiconductor device, and a semiconductor device with such formed shielding layer. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for forming a semiconductor device, the method comprising:

providing a substrate strip having a device array with a plurality of device regions defined by a plurality of saw streets, wherein the plurality of device regions is connected together by a wiring grid formed on a front surface of the substrate strip;

singulating at the saw streets the substrate strip to form a plurality of semiconductor devices each corresponding to one of the plurality device regions, wherein each semiconductor device has a substrate, a bond pad, a dielectric layer, one or more electronic components and an encapsulant layer, the bond pad which is a part of the wiring grid is formed on a front side of the substrate and extends to a first lateral surface of the substrate, the dielectric layer is formed on a front side of the substrate and extends from the bond pad to a second lateral surface of the substrate opposite to the first lateral surface of the substrate, the encapsulant layer is supported on a back side of the substrate and the one or more electronic components are encapsulated in the encapsulant layer;

etching a portion of the bond pad adjacent to the first lateral surface, to form a gap between the bond pad and the first lateral surface;

attaching a filler onto the bond pad to fill the gap;

placing the semiconductor device on a carrier such that the front side of the substrate is close to the carrier;

applying a shielding layer to a back side of the substrate and the first lateral surface and the second lateral surface of the substrate, wherein the filler keeps the bond pad apart from the shielding layer at the first lateral surface, the dielectric layer contacts the shielding layer at the second lateral surface; and unloading the semiconductor device from the carrier such that at least a portion of the bond pad is exposed from the front side of the semiconductor device.

2. The method of claim 1, wherein attaching a filler onto the bond pad to fill the gap further comprises:

attaching the filler that substantially flushes with the dielectric layer to form a flat surface.

3. The method of claim 1, wherein the filler is a tape which includes a first portion filling the gap and a second portion attached onto and covering the bond pad.

4. The method of claim 3, after applying the shielding layer to the back side of the substrate, the method further comprising:

detaching the tape from the bond pad.

5. The method of claim 1, wherein the filler includes an epoxy material.

6. The method of claim 5, wherein attaching a filler onto the bond pad comprises:

dispensing the epoxy material into the gap.

7. The method of claim 1, wherein the shielding layer covers the one or more electronic components.

* * * * *